United States Patent
DeSimone

(10) Patent No.: US 6,929,904 B2
(45) Date of Patent: Aug. 16, 2005

(54) POSITIVE TONE LITHOGRAPHY WITH CARBON DIOXIDE DEVELOPMENT SYSTEMS

(75) Inventor: Joseph M. DeSimone, Chapel Hill, NC (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 75 days.

(21) Appl. No.: 10/294,223

(22) Filed: Nov. 14, 2002

(65) Prior Publication Data

US 2004/0096779 A1 May 20, 2004

(51) Int. Cl.[7] ................................................. G03F 7/30
(52) U.S. Cl. ...................................... 430/331; 430/322
(58) Field of Search ................................ 430/322, 326, 430/3, 31, 331; 510/175

(56) References Cited

U.S. PATENT DOCUMENTS

| | | | |
|---|---|---|---|
| 2,058,761 A | | 10/1936 | Beckman et al. ........... 324/433 |
| 5,066,751 A | * | 11/1991 | Kotachi et al. ............. 526/279 |
| 5,532,106 A | | 7/1996 | Fréchet et al. |
| 5,532,113 A | | 7/1996 | Fréchet et al. |
| 5,536,616 A | | 7/1996 | Frechet et al. |
| 5,545,509 A | | 8/1996 | Cameron et al. |
| 5,648,196 A | | 7/1997 | Fréchet et al. |
| 5,650,261 A | * | 7/1997 | Winkle ..................... 430/270.1 |
| 5,665,527 A | | 9/1997 | Allen et al. |
| 6,001,418 A | | 12/1999 | DeSimone et al. |
| 6,083,565 A | | 7/2000 | Carbonell et al. |
| 6,110,653 A | * | 8/2000 | Holmes et al. ............. 430/325 |
| 6,358,673 B1 | * | 3/2002 | Namatsu ..................... 430/311 |
| 6,379,874 B1 | | 4/2002 | Ober et al. |
| 2002/0119398 A1 | | 8/2002 | DeSimone et al. |
| 2004/0096783 A1 | | 5/2004 | DeYoung et al. ........... 430/322 |

OTHER PUBLICATIONS

D.J. Dixon and K.Johnston in Kirk–Othmer Encyclopedia of Chemical technology; "Supercritical Fluids", Sec.2. (John Wiley—1997).*

Psathas et al. "Water in carbon dioxide emulsions with poly(dimethylsiloxane) based block copolymer ionomers"; Ind.Eng.Chem.Res. v39, (2000) pp2655–2664.*

Cameron, James F., et al., *Photogeneration of amines from α–keto carbamates: design and preparation of photoactive compounds*, J. Chem. Soc., 1:2429–2442 (1997).

Fréchet, Jean M.J.,et al., *Photogenerated Base in Resist and Imaging Materials: Design of Functional Polymers Susceptible to Base Catalyzed Decarboxylation*, Chem. Mater., 9: 2887–2893 (1997).

Havard, Jennifer M., et al., *Functional Design of Environmentally enhanced Water–Soluble Positive–Tone Photoresists*, Polym. Mat. Sci. Eng., 77:424–5 (1997).

Pham, Victor Q., et al., *Positive–Tone Resist for Supercritical $CO_2$ Processing*, Polymer Preprints, 43(2): 885–6 (2002).

Urankar, Edward J., et al., *Photogenerated Base in Polymer Curing and Imaging Design of Reactive Styrenic Copolymers Susceptible to a Base–Catalyzed β–Elimination*, Journal of Polymer ScienceJournal of Polymer Science: Part A: Polymer Chemistry, 35:3543–3552 (1997).

Urankar, Edward J., et al., *Photogenerated Base in Polymer Curing and Imaging Cross–Linking of Base–Sensitive Polymers Containing Enolizable Pendant Groups*, Chem. Mater., 9: 2861–2868 (1997).

Urankar, Edward J., et al., *Base–Sensitive Polymers as Imaging Materials: Radiation–Induced β–Elimination To Yield Poly(4–hydroxystyrene)*. Macromolecules. 30: 1304–1310 (1997).

* cited by examiner

Primary Examiner—Kathleen Duda
(74) Attorney, Agent, or Firm—Myers Bigel Sibley & Sajovec PA

(57) ABSTRACT

A process of forming a resist image in a microelectronic substrate, the process comprises the steps of: (a) providing a substrate having a polymer coating thereon, wherein the polymer is insoluble in water having a pH less than or equal to a specified pH (e.g., 7.0, 6, 5, or 4); then (b) imagewise exposing the coating to radiation such that exposed and unexposed coating portions are formed, with said exposed coating portions being soluble in water having a pH less than or equal to said specified pH7.0; and then (c) contacting said coating to a developing composition comprising carbon dioxide and water, said water having a specified pH less than or equal to 7.0 (and preferably a pH of about 2 or 3 to 4, 5 or 6; i.e. a specified pH less than or equal to 6, 5, or 4), so that said exposed coating portions are preferentially removed from the substrate as compared to said unexposed coating portions to form an image thereon.

18 Claims, No Drawings

POSITIVE TONE LITHOGRAPHY WITH CARBON DIOXIDE DEVELOPMENT SYSTEMS

FIELD OF THE INVENTION

The invention generally relates to processes relating to forming microelectronic devices using carbon dioxide.

BACKGROUND OF THE INVENTION

There are a number of lithography processes which are well known in the art used in conjunction with manufacturing microelectronic devices. A typical lithography process involves aligning and transferring a pattern from a template using optics onto a partially processed substrate (e.g., wafer) that has been coated with a photoresist. The resist is then developed and the resist image is thereafter transferred into the underlying material typically by a chemical and/or thermal step such as, for example, dry/wet etch, sinter, implant, etc. This process is often repeated many times (e.g., between 15 to 20) during the course of building a complex integrated circuit.

The above processing steps can result in distortions being present in the wafer. Thus, wafer handling during processing is extremely important. The wafer handling subsystem is believed to be largely responsible for the throughput of the processing tool. Accordingly, the wafer handling should be designed to minimize sources of possible contamination. A difficulty from a processing standpoint relates to the incompatibility of an organic or aqueous solvent based coating solution and the enclosed equipment (e.g., a vacuum environment) used for processing substrates that have developed photo resist images (positive or negative) formed therein.

U.S. Pat. No. 5,665,527 to Allen et al. proposes a process for generating a negative tone resist image comprising the steps of coating a substrate with a film of a polymeric composition comprising a polymer, a photosensitive acid generator, and acid labile groups, imagewise exposing the film to radiation to generate free acid, and developing the image with critical fluid, e.g., carbon dioxide.

U.S. Pat. Application Ser. No. 2002/0119398 to DeSimone et al. describes $CO_2$ processes, photoresists, polymers and photoactive compounds for positive and negative tone microlithography. Paragraph 45 therein states: "Any of the carbon dioxide-containing compositions may also include additional components, the selection of which is known to one skilled in the art. Exemplary components include, without limitation, aqueous and organic co-solvents, polymer modifiers, water, rheology modifiers, plasticizing agents, flame retardants, antibacterial agents, flame retardants, and viscosity reduction modifiers."

V. Pham et al., *Polymer Preprints* 43, 885 (2002) describes positive-tone resists for supercritical $CO_2$ processing.

Notwithstanding the above, there is a continued need in the art for processes for forming semiconductor devices that involve positive tone resists that may be used with carbon dioxide solvents.

SUMMARY OF THE INVENTION

Herein it is disclosed that water/$CO_2$ systems can be used to develop positive-tone resist systems. This process utilizes a dispersed or co-continuous water-in/$CO_2$ developing solution (e.g., water as the discrete phase in a suspension, dispersion, emulsion, microemulsion, etc. dispersed with surfactants to produce morphologies such as spherical or ellipsoid micelles, thread-like micelles, or other co-continuous morphologies). Under these conditions the water-rich phase has a neutral to acidic pH. This is the result of the formation of carbonic acid when water is treated with $CO_2$. It is the neutral to acidic water-rich phase that is used to remove a portion of the polymer used as a resist that was exposed to light, rendering a positive tone image.

A first aspect of the present invention is, accordingly, a process of forming a resist image in a microelectronic substrate, the process comprising the steps of:

(a) providing a substrate having a polymer coating thereon, wherein the polymer is insoluble in water having a pH less than or equal to a specified pH (e.g., 7.0, 6, 5, or 4); then (b) imagewise exposing the coating to radiation such that exposed and unexposed coating portions are formed, with said exposed coating portions being soluble in water having a pH less than or equal to said specified pH7.0; and then (c) contacting said coating to a developing composition comprising carbon dioxide and water, said water having a specified pH less than or equal to 7.0 (and preferably a pH of about 2 or 3 to 4, 5 or 6; i.e. a specified pH less than or equal to 6, 5, or 4), so that said exposed coating portions are preferentially removed from the substrate as compared to said unexposed coating portions to form an image thereon.

The method is optionally but preferably followed by the step of (d) rinsing the polymer coating with a composition consisting of or consisting essentially of carbon dioxide, to thereby reduce or inhibit image collapse in the coating.

In certain embodiments the polymer in the polymer coating contains or comprises basic sites. In certain embodiments the polymer coating is insoluble in water with a pH less than the specified pH as described above (e.g., a pH of 7.0) when said polymer coating is in protected form; in certain embodiments the polymer coating is soluble in water with a pH less than the specified pH as described above (e.g., a pH of 7.0) when said polymer is in deprotected form.

In certain embodiments of the foregoing, the polymer coating comprises or contains a photoacid generator. In other embodiments of the foregoing, the polymer coating comprises or contains a photobase generator. The polymer coating may further comprise a dissolution inhibitor, and may be used in conjunction with a silylating agent. The photoresist, in one embodiment, contains basic units.

A further aspect of the present invention is a polymeric photoresist that is soluble in a composition comprising carbon dioxide and water after exposure to radiation or electron beam irradiation.

In particular embodiments of the foregoing, the polymer coating may be used as a low-k dielectric layer, e.g., a further conductive layer such as a metal layer (e.g., copper) can be applied in contact with, on top of, adjacent to the polymer coating, in accordance with any suitable technique, with the polymer coating then serving as a low-k dielectric layer, as in, for example, an interdielectric layer of a multilevel wiring of an integrated circuit.

DETAILED DESCRIPTION OF THE PREFERRED EMBODIMENTS

The invention will now be described in greater detail in reference to its preferred embodiments described in the text below and in the drawings. It should be understood that these embodiments are for illustrative purposes only, and do not limit the scope of the invention as defined by the claims.

Various substrates can be used for the purposes of the invention such as, for example, substrates which may comprise any number of materials including, but not limited to, glass, silicon, ceramics, polymer, gallium arsenide, silicon carbide, or the like, and combinations thereof. In various optional embodiments, at least one intermediate layer (e.g., a silicon dioxide layer) may be present between the substrate and the coating.

The step of contacting the substrate which results in the formation of a coating thereon may be carried out using various techniques. Examples of embodiments include, without limitation, a spin coating method, a dip coating method, and a spray coating method. A spin coating method is preferred, and is described in U.S. Pat. No. 6,001,418 to DeSimone et al., the disclosure of which is incorporated herein by reference in its entirety. A meniscus coating technique can also be employed such as one described, for example, in U.S. Pat. No. 6,083,565 to Carbonell et al., the disclosure of which is incorporated herein by reference in its entirety.

Water-soluble polymers that may be used to carry out the present invention may be divided into two types: (a) those that, after exposure, dissolve in water with a pH less than 7.0 because they ionize, such as:

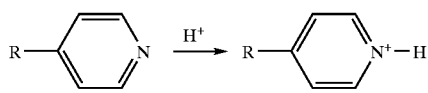

or (b) those that, after exposure, are simply water soluble not due to ionization but due to hydrogen bonding.

Polymers that are rendered soluble in water with a pH less than 7.0 due to ionization typically contain units that are Lewis or Bronsted bases. With such a polymer used as a photoresist, there are limitations on the photochemical event that can be used to render the polymer soluble in water at pH less than 7.0. In particular, one may be challenged using a photoacid generator because the photoacid byproducts may be quenched by the basic sites in the photoresist. As such a photobase generator is preferred. Sometimes a dissolution inhibitor will also be used in the photoresist formulation. Polymers that are used with photoresist and that dissolve in water due to hydrogen bonding have fewer limitations on the photochemical event that renders them soluble in water with a pH less than or equal to 7.0. As such these photoresists can be used with either a photoacid generator or with a photobase generator.

Typical photoacid generators include dinitrobenzyltosylates, sulfonium salts, iodonium salts, diazodisulfone derivatives and sulfonates, etc. and are available from sources such as Wako Chemicals USA, Inc., 1600 Bellwood Road, Richmond, Va. 23237 USA.

Typical photobase generators include quaternary ammonium dithiocarbamates, alpha aminoketones, oxime-urethane containing molecules such as dibenzophenone-oxime hexamethylene diurethan, ammonium tetraorganylborate salts, and N-(2-nitrobenzyloxycarbonyl) cyclic amines.

There are numerous polymers that are sensitive to photobase generators. For example, Frechet has worked extensively in this area (see, e.g., U.S. Pat. Nos. 5,545,509, 5,536,616 and 5,532,106, the disclosures of which are incorporated herein by reference). The difference is that essentially all of the photoresists that he worked with are developed with tetramethyl ammonium hydroxide (TMAH) (i.e., are rendered soluble in water at a pH greater than 7.0, or alkaline conditions). The invention described herein can use the same photochemistries developed by Frechet, but the patterns are developed by $CO_2$/water systems where the pH is less than or equal to 7.0.

Newly envisioned examples of photoresists that may be used to carry out the present invention are:

Scheme I:
Development of a Polymer Resist Containing a Photobase Generator (PAG)

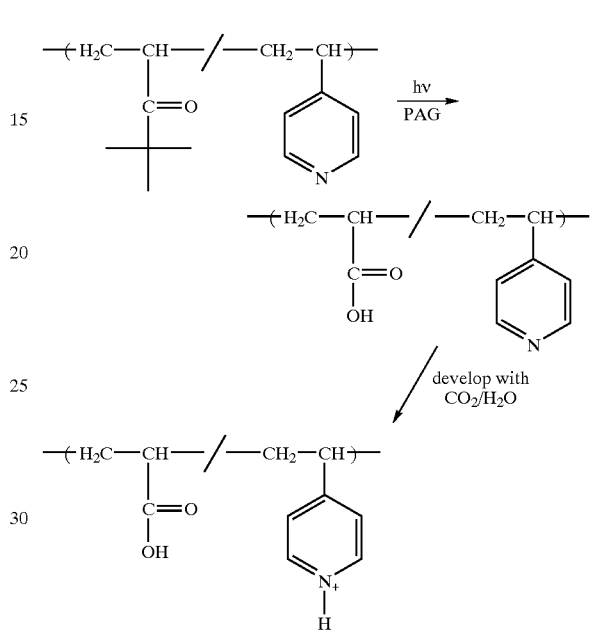

and

Scheme II:
Development of a Photoresist Containing a Photobase (PBG) Generator

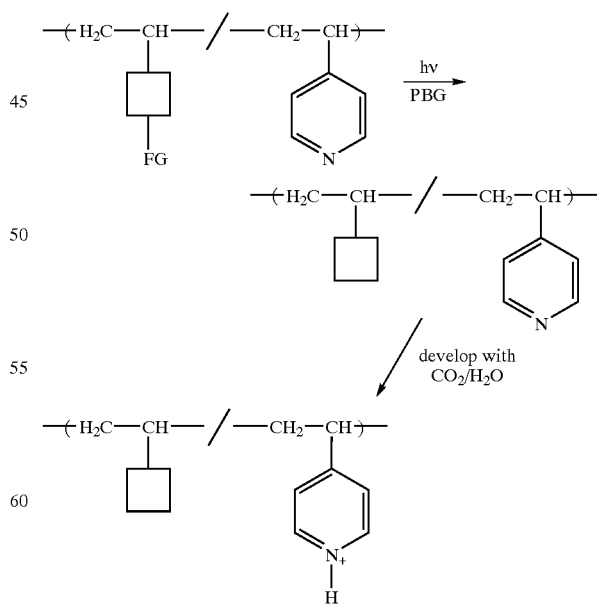

where the box is a linking group, where PFG is a protected functional group, and FG is an unprotected functional group;

and

Scheme III:
Development of a Trimethylsilyl (TMS) Photoresist Containing a Photoacid Generator

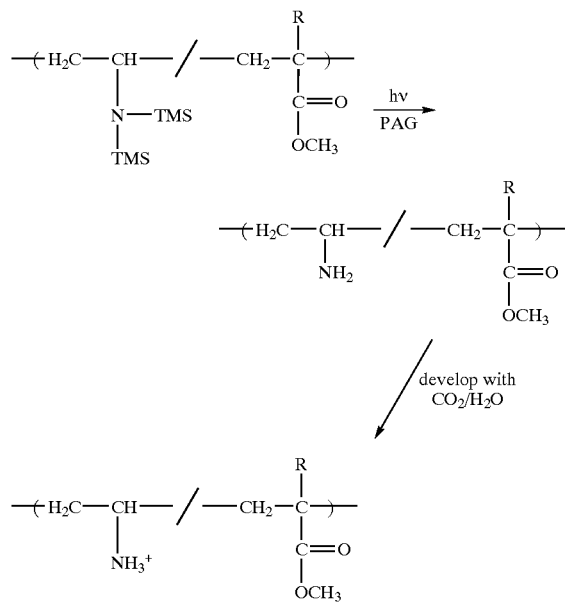

where R may be H or CH$_3$;

and

Scheme IV:
Development of a Photoresist Containing a Photobase (PBG) Generator

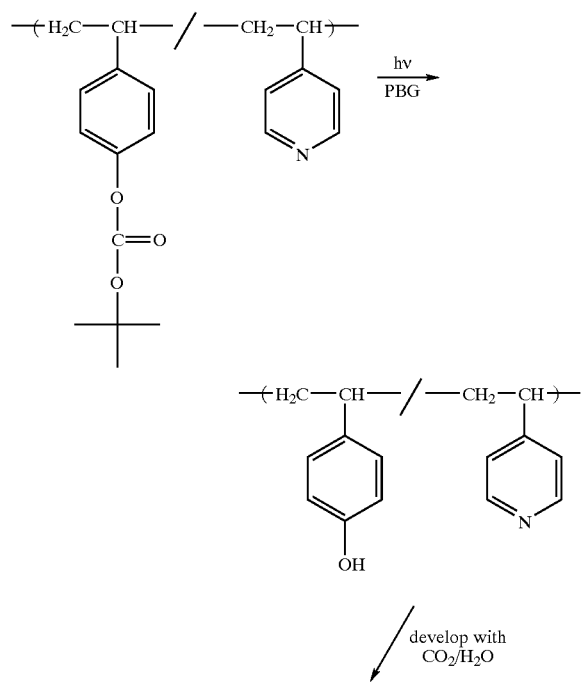

-continued

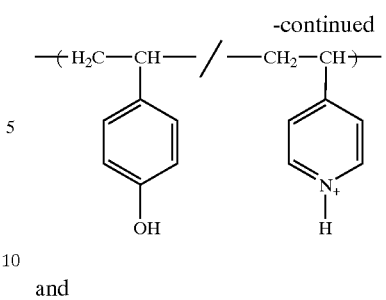

and

Scheme V:
Development of Photoresist with a PBG

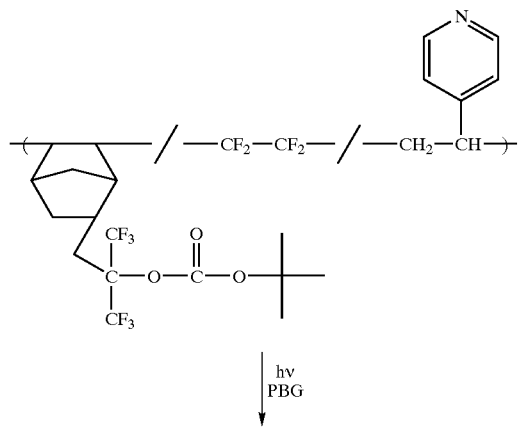

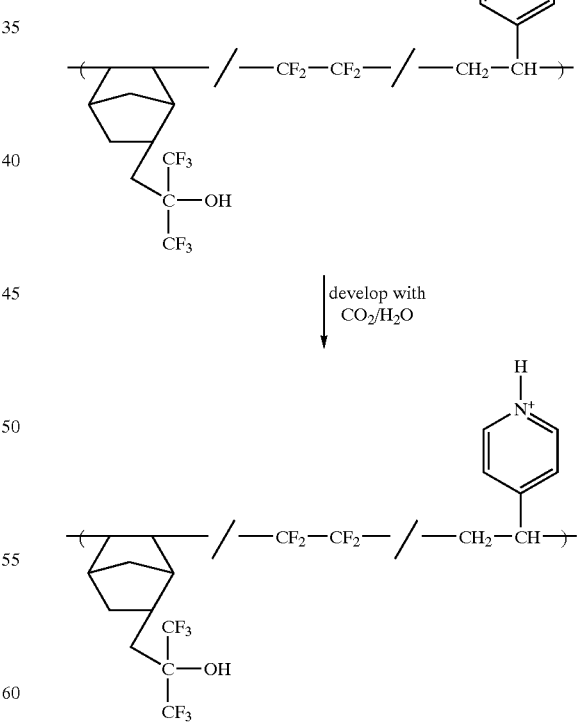

As described above, the coating is imagewise exposed to radiation as described in U.S. Pat. No. 5,665,527 to Allen et al., the disclosure of which is incorporated herein by reference in its entirety. Various radiation techniques including electromagnetic radiation such X-ray and light, including deep ultraviolet and extreme ultraviolet light, including light at wavelengths of 365 nm, 248 nm, 193 nm, and 157 nm. Suitable radiation sources include, without limitation, mercury, mercury/xenon, xenon lamps, and X-ray. Visible radiation can also be employed. A typical radiation source is ArF excimer or KrF excimer.

The invention may optionally include other embodiments. In one aspect for example, the invention may further comprise the steps of depositing a metal-containing material or an ionic material on the surface of the substrate from which the exposed or the unexposed coating portions was removed, and removing the remaining (exposed or unexposed) coating portion from the substrate. The step of depositing a metal-containing material or an ionic material can be carried out (e.g., processed) by any number of methods including, without limitation, ion implant, metal deposition, and the like. Metal depositions techniques include, without limitation, evaporation sputtering, chemical vapor deposition, or laser-induced deposition. Suitable metal-containing materials include conductive metals such as, but not limited to, aluminum, copper, gold, titanium, tantalum, tungsten, molybdenum, silver, combinations thereof, and alloys thereof. Suitable ionic materials include, but are not limited to, inorganic ions such as boron, phosphorous, or arsenic which can be implanted. Accordingly, n- or p-doped transistors can be formed. In one preferred embodiment, the method further comprises removing the exposed coating portion from the substrate comprises contacting the exposed coating portion with a carbon dioxide containing fluid such that the exposed coating portion is removed from the substrate. In another preferred embodiment, the method comprises removing the unexposed coating portion from the substrate comprises contacting the unexposed coating portion with a carbon dioxide containing fluid such that the unexposed coating portion is removed from the substrate.

Other embodiments that may be encompassed by the invention include, for example, depositing one or more insulating layers (e.g., interlayer dielectrics (ILDs)) and/or one or more anti-reflective coatings on the substrate. These steps may be carried out in a manner appropriate with the other steps of the process of the invention. The ILDs may be used to keep signals in the microelectronic device from straying between the conducting lines on the chip. Examples of ILDs include, without limitation, materials with low dielectric constants such as SiLK resins made commercially available by The Dow Chemical Company of Midland, Mich. (described in detail herein) and Teflon AF™ made commercially available by E.I. DuPont de Nemours of Wilmington, Del. Examples of materials for anti-reflective coatings include, without limitation, a fluorinated material based on a fluoroacrylate polymer of polymer precursor.

Carbon dioxide used to carry out any of the steps of the present invention is employed in a liquid or supercritical phase. If liquid $CO_2$ is used, the temperature employed during the process is preferably below 31° C. As used herein, "supercritical" means that a fluid medium is at a temperature that is sufficiently high that it cannot be liquefied by pressure. The thermodynamic properties of $CO_2$ are reported in Hyatt, J. Org. Chem. 49: 5097–5101 (1984); therein, it is stated that the critical temperature of $CO_2$ is about 31° C.

The carbon dioxide-containing composition may also include additional components, the selection of which is known to one skilled in the art. Exemplary components include, without limitation, aqueous and organic co-solvents, polymer modifiers, rheology modifiers, plasticizing agents, flame retardants, antibacterial agents, flame retardants, and viscosity reduction modifiers.

The foregoing is illustrative of the present invention, and is not to be construed as limiting thereof. The invention is defined by the following claims, with equivalents of the claims to be included therein.

That which is claimed is:

1. A process of forming a resist image in a microelectronic substrate, said process comprising the steps of:
   (a) providing a substrate having a polymer coating thereon, wherein said polymer is insoluble in water having a pH less than or equal to 7.0; then
   (b) imagewise exposing the coating to radiation such that exposed and unexposed coating portions are formed, with said exposed coating portions being soluble in water having a pH less than or equal to 7.0; and then
   (c) contacting said coating to a developing composition comprising carbon dioxide and water, said water having a pH less than or equal to 7.0, so that said exposed coating portions are preferentially removed from the substrate as compared to said unexposed coating portions to form an image thereon.

2. The process according to claim 1, wherein said polymer coating comprises a photoacid generator.

3. The process according to claim 1, wherein said polymer coating comprises a photobase generator.

4. The process according to claim 1, wherein said polymer coating comprises a dissolution inhibitor.

5. The process according to claim 1 wherein said polymer coating contains basic sites.

6. The process according to claim 1 wherein said polymer coating is insoluble in water with a pH less than 7.0 when said polymer coating is in protected form.

7. The process according to claim 1 wherein said polymer coating is soluble in water with a pH less than 7.0 when said polymer is in deprotected form.

8. The process according to claim 1, wherein said polymer coating comprises a silylating agent.

9. The process according to claim 1, wherein said radiation is light.

10. The process according to claim 1, wherein said radiation is ultraviolet light.

11. The process according to claim 1, further comprising the step of:
   (d) rinsing said coating with a second composition consisting essentially of carbon dioxide, whereby image collapse in said coating is inhibited.

12. The process according to claim 1, wherein said carbon dioxide is liquid carbon dioxide.

13. The process according to claim 1, wherein said carbon dioxide is supercritical carbon dioxide.

14. A process of forming a resist image in a microelectronic substrate, said process comprising the steps of:
   (a) providing a substrate having a polymer coating thereon, wherein said polymer is insoluble in water having a pH less than or equal to 5; then
   (b) imagewise exposing the coating to radiation such that exposed and unexposed coating portions are formed, with said exposed coating portions being soluble in water having a pH less than or equal to 5; and then
   (c) contacting said coating to a developing composition comprising carbon dioxide and water, said water having a pH less than or equal to 5, so that said exposed coating portions are preferentially removed from the substrate as compared to said unexposed coating portions to form an image thereon.

15. The process according to claim 14, wherein said polymer coating comprises a photoacid generator.

16. The process according to claim 14, wherein said polymer coating comprises a photobase generator.

17. The process according to claim 14, wherein said polymer coating comprises a dissolution inhibitor.

18. The process according to claim 14 wherein said polymer coating contains basic sites.

* * * * *